(12) United States Patent
Kim et al.

(10) Patent No.: US 6,294,016 B1
(45) Date of Patent: Sep. 25, 2001

(54) METHOD FOR MANUFACTURING P-TYPE GAN BASED THIN FILM USING NITRIDATION

(75) Inventors: Sang Woo Kim; Ji Myon Lee; Kwang Soon Ahn; Rae Man Park; Ja Soon Jang; Seong Ju Park, all of Kwangju (KR)

(73) Assignee: Kwangju Institute of Science and Technology, Kwangju (KR)

(*) Notice: Subject to any disclaimer, the term of this patent is extended or adjusted under 35 U.S.C. 154(b) by 0 days.

(21) Appl. No.: 09/421,028

(22) Filed: Oct. 20, 1999

(51) Int. Cl.$^7$ .................................................. C30B 1/10
(52) U.S. Cl. .................. 117/4; 117/2; 117/3; 117/5; 117/6; 117/8; 117/88; 117/104; 117/952
(58) Field of Search ............................. 117/2, 3, 88, 104, 117/952, 4, 5, 6, 8; 438/46, 47, 93, 94, 186, 569, 572, 590, 604, 605, 745, 796; 257/11, 189, 201, 279, 615

(56) References Cited

U.S. PATENT DOCUMENTS

| | | | |
|---|---|---|---|
| 4,448,633 | 5/1984 | Shuskus | 156/610 |
| 4,913,929 | 4/1990 | Moslehi | 427/39 |
| 5,306,662 | * 4/1994 | Nakamura et al. | 438/509 |
| 5,633,192 | 5/1997 | Moustakas et al. | 438/46 |
| 5,766,695 | 6/1998 | Nguyen et al. | 427/553 |
| 6,100,174 | * 8/2000 | Takatani | 438/605 |

FOREIGN PATENT DOCUMENTS

| | | | |
|---|---|---|---|
| 7-97300 | 4/1995 | (JP) | H01L/21/26 |
| 10-17400 | 1/1998 | (JP) | H01L/21/205 |

* cited by examiner

*Primary Examiner*—Robert Kunemund
(74) *Attorney, Agent, or Firm*—Knobbe, Martens, Olson & Bear, LLP

(57) ABSTRACT

Disclosed is a method for manufacturing a high conductivity p-type GaN-based thin film superior in electrical and optical properties by use of nitridation and RTA (rapid thermal annealing) in combination. A GaN-based epitaxial layer is grown to a desired thickness while being doped with Mg dopant with a carrier gas of hydrogen by use of a MOCVD process. The film thus obtained is subjected to nitridation using nitrogen plasma and RTA in combination. The p-type GaN-based thin film exhibits high hole concentration as well as low resistivity, so that it can be used where high electrical, optical, thermal and structural properties are needed. The method finds application in the fabrication of blue/white LEDs, laser diodes and other electronic devices.

6 Claims, 2 Drawing Sheets

METHOD FOR MANUFACTURING P-TYPE GAN BASED THIN FILM USING NITRIDATION

BACKGROUND OF THE INVENTION

1. Field of the Invention

The present invention relates, in general, to a method for manufacturing a p-type GaN-based thin film using plasma nitridation together with rapid thermal annealing (hereinafter referred to as "RTA"), thereby providing high hole concentration for the thin film. Formation of p-type GaN-based thin films with high hole concentration is one of the most essential techniques in fabricating optoelectronic devices such as blue/white light emitting diodes (LEDs), laser diodes (LDs) and electronic devices which employ nitride semiconductors.

2. Description of the Prior Art

Reliable formation of high conductivity p-type GaN is one of the most demanding techniques in fabricating optoelectronic devices such as blue-green light emitting diodes (LEDs), blue laser diodes (LDs), and solar-blind ultraviolet photodetectors. For Mg-doped GaN grown by metalorganic chemical vapor deposition (MOCVD), however, it was difficult to obtain p-type conductivity due to the passivation by electrically inactive Mg—H complexes which are formed in the films by hydrogen from the growth ambient. To overcome this problem, a low energy electron beam irradiation [H. Amano el al., Jpn. J. Appl. Phys. 28, L2112 (1989)] or a RTA at 700° C. for 20 min in an $N_2$ ambient [S. Nakamura et al., Jpn. J. Appl. Phys. 31, L139 (1992)] has been commonly employed to dissociate hydrogen from the Mg—H complexes, giving rise to a p conduction with hole density in the low $10^{17}$ $cm^{-3}$ range. Currently, RTA dominates over other treatments in activating the Mg acceptors. The problem has been intensified by the presence of compensating donor defects, e.g., the nitrogen vacancy whose formation is energetically favorable under p-type conditions. To date, the activation of the Mg acceptors in GaN thin films grown by a MOCVD process has been utterly dependent on such thermal treatments. However, the self-compensation can not be mastered by the post growth treatments and remains to be overcome to achieve hole concentration above mid-$10^{17}$ $cm^{-3}$. In this regard, a new technique to further improve the p-conductivity is highly desired in the GaN-based III-nitride thin films.

SUMMARY OF THE INVENTION

The intensive and thorough research on the p-type GaN-based III-nitrides repeated by the present inventors, resulted in the finding that the combined treatment of nitrogen plasma irradiation (hereinafter referred to as "nitridation") along with RTA annealing can better remove the hydrogen existing in the p-type GaN-based thin films compared with RTA treatment only, thus promote the activation of Mg acceptors from Mg—H complexes effectively.

Therefore, it is an object of the present invention to overcome the above problems encountered in prior arts and to provide a method for forming an enhanced p-type conductivity in GaN-based thin films which have low resistivity with high hole concentration.

In accordance with the present invention, the above objects could be accomplished by a provision of a method for forming a p-type GaN-based thin film, comprising the steps of: forming a thin GaN nucleation layer by use of a MOCVD process; growing the GaN-based epitaxial layer to a desired thickness while doping the epitaxial layer with magnesium, with hydrogen serving as carrier gas; subjecting the grown layer to nitridation and RTA treatment in combination.

BRIEF DESCRIPTION OF THE DRAWINGS

The above and other objects and aspects of the invention will become apparent from the following description of embodiments with reference to the accompanying drawings in which.

DETAILED DESCRIPTION OF THE INVENTION

Figure 1:
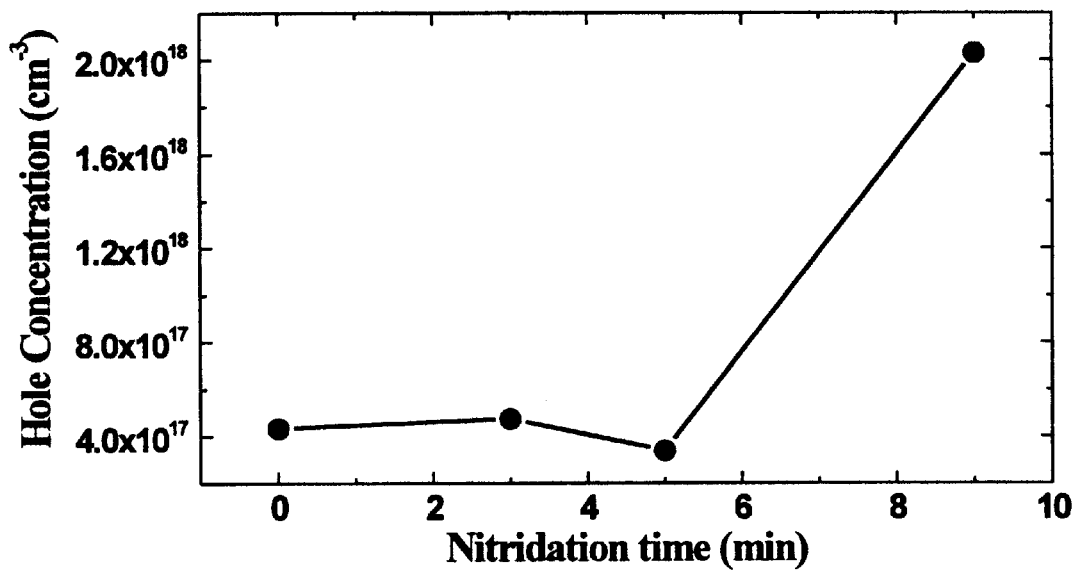
FIG. 1 is a graph in which the hole concentrations of GaN thin film which had the hole concentration of $4.35 \times 10^{17}$ $cm^{-3}$ when undergoing only RTA at 950° C. for 1 min, are plotted as a function of the period of time for which a nitridation treatment is carried out at 300° C. along with RTA.

To approach the invention, which pertains to the formation of a Mg-doped p-type GaN thin film with high hole concentration, account is taken of the following fundamentals:

In Mg-doped GaN films grown by MOCVD in a hydrogen ambient, the Mg acceptors are passivated by H acceptors, to yield electrically inert Mg—H complexes. In order to activate the Mg, post-growth treatments are necessary. The dissociation energy of the Mg—H complexes is 1.5 eV so that a temperature as low as approximately 300° C. is enough to detach hydrogen from the complex. It has been found, however, that RTA of Mg-dope GaN needs to be carried out at much higher temperature around 700–1,000 ° C. The reason is that mere dissociation of the Mg—H complex is insufficient; the H which is released from the Mg acceptors needs to be either removed (to the surface or into the substrate) or neutralized (e.g., at extended defects). Otherwise, the H atom (a donor) continue to compensate the Mg, and is recaptured when the sample is cooled down again upon RTA treatment. The high RTA temperatures required for Mg activation therefore reflect an activation barrier for incorporating H in a different form inside the p-doped layer (e.g., attached to extended defects), or for removal of H from the film through desorption from the surface. Next, the difficulty of forming a p-type GaN-based thin film with high hole concentration is also found in that nitrogen vacancies within the thin film serve as donors and combine with the activated Mg acceptors, thereby electrically neutralizing the acceptors.

In the following it will be clear that this newly designed treatment helps H to be easily desorbed from the surface and removes nitrogen vacancy as well. In the invention, nitridation is introduced along with RTA, so as to advance the formation of an Mg-doped p-type GaN-based thin film with high hole concentration. Details will be given of a method for forming an Mg-doped p-type GaN-based thin film with high hole concentration, below.

As a gallium source and a nitrogen source to grow a GaN thin film, trimethylgallium (TMGa) and high purity ammonia ($NH_3$) are used, respectively. For GaN-based thin films, aluminum and indium, elements belonging to Group IIIB, like gallium, may be used together with gallium. In this case, an aluminum source and an indium source are usually taken from trimethylaluminum (TMAl) and trimethylindium (TMIn) respectively. When doping the thin film with magnesium, bis(cyclopentadienyl)magnesium ($Cp_2Mg$) is used as a magnesium source. Hydrogen gas is used as a carrier gas.

In order to grow a GaN-based thin film on a (0001) sapphire substrate, first, a nucleation layer is formed to a thickness of 300 Angstrom at 500–550° C. by use of a MOCVD process. Subsequently, the MOCVD reactor is constantly maintained at 1,000–1,100° C. for 30 min under a pressure of 180–220 Torr to produce a Mg-doped p-type GaN-based thin film to 1 μm thickness. The nitridation treatment using $N_2$ plasma is carried out in a plasma enhanced chemical vapor deposition (PECVD) chamber under the conditions of a pressure of 10 Torr or lower and a temperature of 10–1000° C. for 1–120 min with a nitrogen flow of 1–4000 sccm, to yield N—H precursors and make the surface of the thin film rich in nitrogen. Under nitrogen or an inert gas (such as helium, neon and argon) atmosphere, RTA is conducted at 400–1,100° C. for 10 sec to 60 min to convert unstable N—H precursors into ammonia gas ($NH_3$) which is, then, released into the air. Therefore, the hydrogen content in the nitridated samples is more effectively reduced than that in the only RTA treated samples, which results in decreased content of the Mg—H complex (decreased hydrogen passivation) and thus increased hole concentration. In addition, the combined treatment of nitridation together with RTA allows the abundant nitrogen atoms on the surface of the thin film to diffuse into the film. This also contributes to eliminating the nitrogen vacancies which act as compensating donors and further increases hole concentration of the Mg-doped GaN.

A better understanding of the present invention may be obtained in the following examples which are set forth to illustrate, but are not to be construed to limit the present invention.

COMPARATIVE EXAMPLE

Upon the growth of a GaN thin film by a MOCVD reactor using a vertical type disc at a high rotational speed, trimethylgallium (TMGa) and high purity ammonia ($NH_3$) were used as a gallium source and a nitrogen source, respectively, while magnesium to be doped in the thin film was taken from bis(cyclopentadienyl)magnesium ($Cp_2$ Mg). As carrier gas, high purity hydrogen gas was employed.

Under these conditions, a nucleation layer was grown to a thickness of 300 Angstrom at 530° C. on a (0001) sapphire substrate. An epitaxial layer was grown at 1,020° C. for 30 min under 200 Torr to yield a 1 μm thick Mg-doped p-type GaN thin film, and followed by conducting an RTA process at 950° C. for 1 min in an $N_2$ ambient. The GaN thin film thus obtained was found to have the hole concentration of $4.35 \times 10^{17}$ $cm^{-3}$ as measured by HL5500 Hall system, commercially available from Bio-Rad Microscience.

EXAMPLE I

The procedure of Comparative Example was repeated until a 1 μm thick Mg-doped p-type GaN thin film was obtained. After RTA was carried out at 950° C. for 1 min, the GaN thin film was subjected to nitridation using nitrogen plasma. At this point, nitrogen gas was introduced at a flow of 500 sccm at 300° C. under 1 Torr while varying the nitridation time from zero to 9 min. Thereafter, RTA was carried out at 600 ° C. for 2 min. The thin film was measured for the hole concentration by use of HL5500 Hall system (Bio-Rad Microscience).

The hole concentration measured was plotted against the nitridation time and the result is given in FIG. 1. As apparent from the plot, the GaN thin films nitridated for 3–5 min have a comparable hole concentration compared with GaN thin film described in Comparative Example, but hole concentration drastically increases at a nitridation time of 9 min.

EXAMPLE II

Upon the growth of a GaN thin film by a MOCVD reactor using a vertical type disc at a high rotational speed, trimethylgallium (TMGa) and high purity ammonia ($NH_3$) were used as a gallium source and a nitrogen source, respectively, while magnesium to be doped in the thin film was taken from bis(cyclopentadienyl)magnesium ($Cp_2Mg$). As carrier gas, high purity hydrogen gas was employed.

Under this condition, after a nucleation layer was grown to a thickness of 300 Angstrom at 510° C. on a (0001) sapphire substrate, an epitaxial layer was grown at 1,000° C. for 30 min under 180 Torr to yield a 1 μm thick Mg-doped p-type GaN thin film. Subsequently, the thin film is subjected to an RTA process at 950° C. for 1 min in an $N_2$ ambient. The GaN thin film thus obtained was found to have the hole concentration of $2.84 \times 10^{17}$ $cm^{-3}$ and resistivity of 1.49 ohm-cm, as measured by HL5500 Hall system, commercially available from Bio-Rad Microscience.

Separately, after the RTA process at the same condition, nitridation was conducted using nitrogen plasma, in which nitrogen gas was introduced at a flow of 500 sccm at a pressure of 1 Torr for 9 min at various temperatures from 250 to 380° C. Thereafter, another RTA process was done at 600° C. for 2 min in an $N_2$ ambient. The resulting thin films were measured for hole concentration and resistivity.

Figure 2:
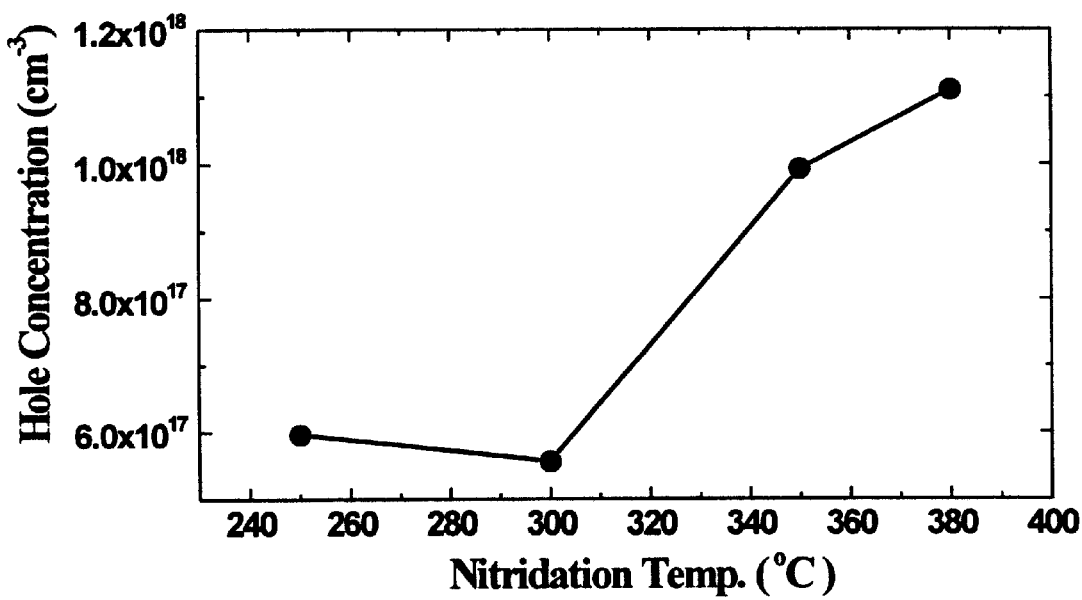
FIG. 2 is a graph in which the hole concentrations of GaN thin film which had the hole concentration of $2.84 \times 10^{17}$ $cm^{-3}$ when undergoing only RTA at 950° C. for 1 min, are plotted as a function of the reaction temperatures at which a nitridation treatment is carried out along with RTA.
Figure 3:
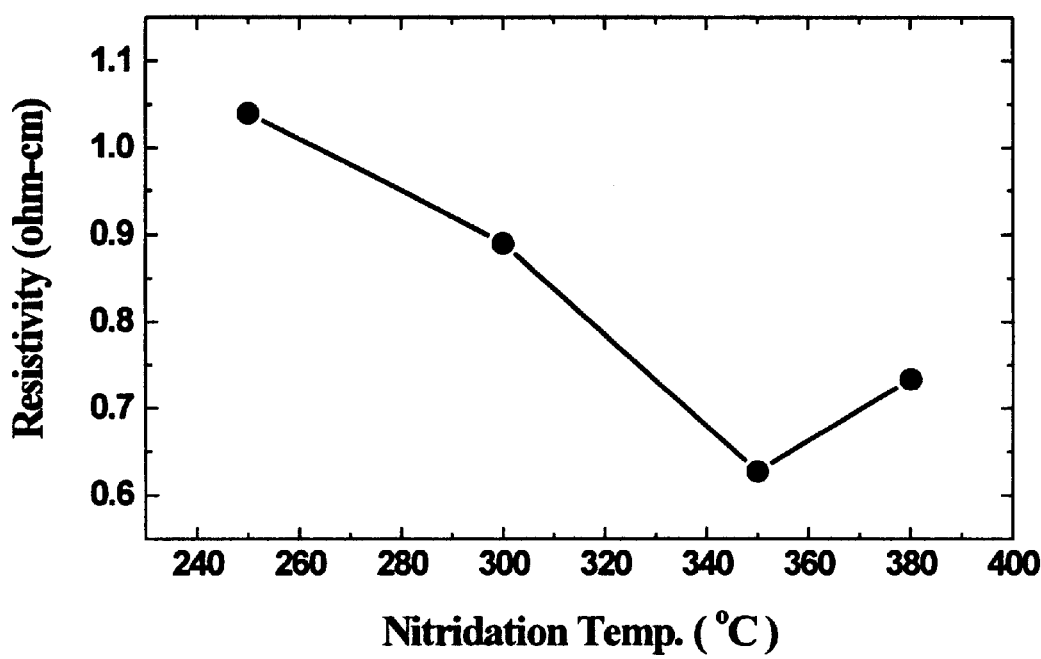
FIG. 3 is a graph in which the resistivities of CaN thin film which had the resistivity of 1.49 ohm-cm when undergoing only RTA at 950° C. for 1 min, are plotted as a function of the nitridation temperatures at which a nitridation treatment is carried out along with RTA.

The measurements for hole concentration and resistivity are given in FIGS. 2 and 3, respectively. As apparent from FIG. 2, the hole concentration of the thin film which experienced the nitridation along with RTA, is greater than that of the thin film which experienced only RTA over the entire temperature range experimented. Also, the hole concentration rapidly increases after a nitridation temperature of 300° C. The data of FIG. 3 show that the nitridated samples are still lower in resistivity than the sample which did not experience the nitridation.

EXAMPLE III

In order to remove a native oxide and oxynitrides formed on the p-type GaN thin film which underwent the nitridation treatment under the optimal condition at 380° C. as in Exampleяe the thin film was immersed in boiling HCL and $HNO_3$ for 10 min. After being spin-coated at 5,500 rpm for 60 sec with a photo-resist, the thin film was baked at 88° C. for 20 min. For developing a mask pattern, then, the specimen was aligned with a mask and exposed to UV for 5 sec, followed by immersing the specimen in a developing solution for 30 sec. The specimen was dried by blowing a nitrogen gas, after which Pt was deposited at a thickness of 300E on the specimen using an electron-beam evaporater. After undergoing a lift-off process with acetone, the specimen was measured for current-voltage characteristics by use of a parameter analyzer(HP4155).

Figure 4:
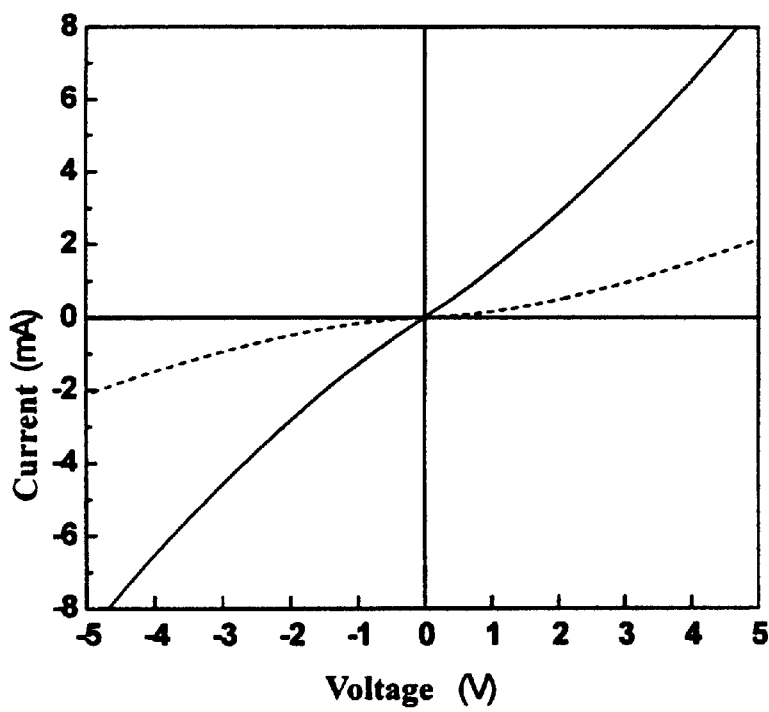
FIG. 4 is a graph which shows the current-voltage characteristics for a metal film on a p-type GaN thin film which experienced a conventional RTA only (dotted line) and for a metal film on a p-type GaN thin film which is prepared according to the present invention(real line).

FIG. 4 shows the current-voltage characteristics for a metal film on a p-type GaN thin film which experienced a conventional RTA only(dotted line) and for a metal film on a p-type GaN thin film which is prepared according to the present invention (real line). As apparent, the conventional p-type GaN thin film has a specific contact resistance of as high as $2 \times 10^{-2}$ ohm-cm$^2$ without showing an ohmic characteristic. In contrast, the p-type GaN thin film is as low as $7 \times 10^{-5}$ ohm-cm$^2$ in specific contact resistance, showing an ohmic characteristic.

Taken together, the data obtained in the above examples demonstrates that the Mg-doped p-type GaN thin film which is prepared by a combination of nitridation and RTA is far superior in electrical and optical properties to conventional thin films. This high hole concentration has the benefit that the ohmic properties between an electrode and the thin film are not largely affected by the metal used for the electrode, and thus enable optical devices to be easily fabricated. In addition, the p-type GaN thin film can be given arbitrarily hole concentration and resistivity values by controlling the nitridation condition. Therefore, the method according to the present invention can play an essential role in developing high quality LEDs or LDs. As a matter of course, the present invention can be applied for the electronic and optical devices which are in need of high hole concentration.

The present invention has been described in an illustrative manner, and it is to be understood the terminology used is intended to be in the nature of description rather than of limitation. Many modifications and variations of the present invention are possible in light of the above teachings. Therefore, the invention in its broader aspects is not limited to the specific details, and illustrated examples shown and described herein. Accordingly, various modifications may be made without departing from the sprit or scope of the general inventive concept as defined by the appended claims.

What is claimed is:

1. A method for manufacturing a high conductivity p-type GaN-based III-nitride thin film, comprising the steps of:

growing a GaN-based epitaxial layer while doping the epitaxial layer with magnesium with hydrogen serving as a carrier gas by the use of a metalorganic chemical vapor deposition system;

conducting a first rapid thermal anneal (RTA) in a nitrogen ambient;

subjecting the grown layer to nitridation and a second RTA (rapid thermal annealing) in combination.

2. A method for manufacturing a high conductivity p-type GaN-based III-nitride thin film, comprising the steps of:

growing a GaN-based epitaxial layer while doping the epitaxial layer with magnesium with hydrogen serving as a carrier gas by the use of a metalorganic chemical vapor deposition system;

subjecting the grown layer to nitridation and RTA (rapid thermal annealing) in combination, wherein the nitridation is carried out at 10–1,100° C. for 1–120 min under 10 Torr or less, using nitrogen plasma with a nitrogen flow of 1–4,000 sccm.

3. A method as set forth in claim 1, wherein the second RTA is carried out at 400–1,100° C. for 1 sec-60 min in a gas atmosphere selected from the group consisting of nitrogen, helium, neon and arson.

4. A method as set forth in claim 1, wherein the p-type GaN-based III-nitride thin film is composed of GaN, AlGaN and InGaN.

5. A method for manufacturing a high conductivity p-type GaN-based III-nitride thin film, comprising the steps of:

growing a GaN-based epitaxial layer while doping the epitaxial layer with magnesium with hydrogen serving as a carrier gas by the use of a metalorganic chemical vapor deposition system;

subjecting the grown layer to nitridation and RTA (rapid thermal annealing) in combination, further comprising the step of immersing the p-type GaN-based III-nitride thin film in a mix solution of hydrochloric acid and nitric acid to remove native oxides prior to depositing a p-type electrode, said native oxides being formed, in abundance, on a surface of the thin film.

6. The method of claim 1 wherein the GaN-based epitaxial layer is grown to a thickness of approximately 1.0 $\mu$m.

* * * * *

UNITED STATES PATENT AND TRADEMARK OFFICE
CERTIFICATE OF CORRECTION

PATENT NO.   : 6,294,016 B1 Page 1 of 1
DATED        : September 25, 2001
INVENTOR(S)  : Kim et al.

It is certified that error appears in the above-identified patent and that said Letters Patent is hereby corrected as shown below:

<u>Column 6,</u>
Line 23, where it reads "arson" should read -- argon --.

Signed and Sealed this

First Day of July, 2003

JAMES E. ROGAN
*Director of the United States Patent and Trademark Office*